US011099239B2

(12) United States Patent
Zabrocki et al.

(10) Patent No.: US 11,099,239 B2
(45) Date of Patent: Aug. 24, 2021

(54) MEASURING DEVICE FOR USE IN AN ELECTRIC SWITCHING DEVICE

(71) Applicant: Eaton Intelligent Power Limited, Dublin (IE)

(72) Inventors: Bogdan Zabrocki, Neunkirchen-Seelscheid (DE); Sabine Firmenich, Bonn (DE); Josef Knopp, Bonn (DE); Ralph Kriechel, Alfter (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 177 days.

(21) Appl. No.: 16/198,806

(22) Filed: Nov. 22, 2018

(65) Prior Publication Data

US 2019/0162786 A1 May 30, 2019

(30) Foreign Application Priority Data

Nov. 24, 2017 (DE) ...................... 10 2017 127 888.5

(51) Int. Cl.
| | | |
|---|---|---|
| *G01R 19/00* | (2006.01) | |
| *G01R 31/327* | (2006.01) | |
| *G01R 15/18* | (2006.01) | |
| *G01R 15/04* | (2006.01) | |

(52) U.S. Cl.
CPC ......... *G01R 31/3277* (2013.01); *G01R 15/04* (2013.01); *G01R 15/181* (2013.01); *G01R 19/0084* (2013.01); *G01R 19/0092* (2013.01); *G01R 31/3278* (2013.01)

(58) Field of Classification Search
CPC ........... G01R 15/181; H01H 2083/201; H01H 71/123; H02H 11/005; H02H 1/0015; H02H 1/003
See application file for complete search history.

(56) References Cited

U.S. PATENT DOCUMENTS

| | | | |
|---|---|---|---|
| 7,084,617 B2 | 8/2006 | Ozaki et al. | |
| 9,455,099 B2* | 9/2016 | Freyermuth | ......... H01H 9/0016 |
| 2003/0184931 A1* | 10/2003 | Morris | ................. H02H 11/005 |
| | | | 361/42 |
| 2012/0063935 A1* | 3/2012 | Fujimura | ............... F04B 39/121 |
| | | | 417/410.1 |
| 2012/0098519 A1* | 4/2012 | Juds | ...................... G01R 15/142 |
| | | | 324/76.11 |

(Continued)

FOREIGN PATENT DOCUMENTS

| | | |
|---|---|---|
| DE | 20304461 U1 | 7/2003 |
| DE | 102005018357 A1 | 11/2005 |

(Continued)

*Primary Examiner* — Alesa Allgood
(74) *Attorney, Agent, or Firm* — Leydig, Voit & Mayer, Ltd.

(57) ABSTRACT

A measuring device includes: a sensor arrangement; and an insulating support for use in an electric switching device. The sensor arrangement includes at least a sensor for measuring at least one of a current strength and a voltage of an electric current flowing through an electric path. The insulating support includes a sleeve comprised of electrically insulating material, the sleeve enclosing a space enclosing the electric path. The sensor arrangement is arranged on an outer side of the sleeve.

13 Claims, 8 Drawing Sheets

(56) References Cited

U.S. PATENT DOCUMENTS

2016/0055985 A1* 2/2016 Watford ................ H01H 71/08
200/284
2016/0178661 A1* 6/2016 Olivier .................. B23K 26/21
324/156

FOREIGN PATENT DOCUMENTS

DE 102006050526 A1 9/2007
EP 2590198 A1 5/2013

* cited by examiner

MEASURING DEVICE FOR USE IN AN ELECTRIC SWITCHING DEVICE

CROSS-REFERENCE TO PRIOR APPLICATION

Priority is claimed to German Patent Application No. DE 10 2017 127 888.5, filed on Nov. 24, 2017, the entire disclosure of which is hereby incorporated by reference herein.

FIELD

The invention relates to a measuring device with a sensor arrangement and an insulating support for use in an electric switching device, wherein the sensor arrangement comprises at least a sensor for measuring at least one of the parameters, [specifically] current strength and voltage, of an electric current flowing through an electric path, and an electric switching device with at least one electric path, wherein for every electric path, a measuring device is provided.

BACKGROUND

In order to register an energy flow in electric circuits, currents and voltages in the load circuit are measured. In order to measure the currents, transformer measuring systems are used in particular in switching devices. In order to measure a voltage, it is tapped at an electric path, that is, for instance from an external conductor, a primary line, or a pole of the switch, and then channeled via a resistor chain into a triggering unit for additional processing. One possibility of a voltage tap integrated in a power switch is known from document EP 2 590 198 A1. This document describes a power switch with a switch enclosure, an electronics module, and with at least one contact for tapping a voltage from a primary line. The tapped voltage is reduced by means of voltage dividers. In order to avoid conducting the high voltage signal unnecessarily via strip conductors, lines, adapters, and contacts to electronics module, which would lead to contamination, high temperatures, possibly to creepage segments and to interferences with the electronics by electrical or electromagnetic effects, it is proposed that within the switch enclosure, an adapter be provided in order to reduce the tapped voltage of the primary line, wherein the adapter is arranged outside of the electronics module.

SUMMARY

In an embodiment, the present invention provides a measuring device, comprising: a sensor arrangement; and an insulating support configured for use in an electric switching device, wherein the sensor arrangement comprises at least a sensor configured to measure at least one of a current strength and a voltage of an electric current flowing through an electric path, wherein the insulating support comprises a sleeve comprised of electrically insulating material, the sleeve enclosing a space configured to enclose the electric path, and wherein the sensor arrangement is arranged on an outer side of the sleeve.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 2 shows a view of the opened switching device according to FIG. 1a;

DETAILED DESCRIPTION

Figure 1A:
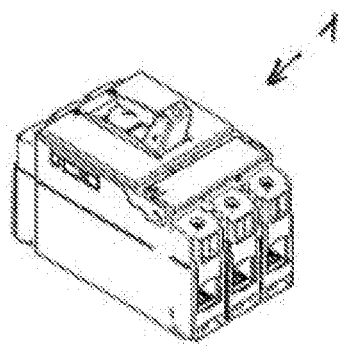
FIGS. 1a and 1b show two electric switching devices from prior art.

In an embodiment, the present invention provides a measuring device for use in an electric switching device, in which a current and/or a voltage measurement is designed such that both secondary measurement signals are conducted in isolation from the primary input signal of the external conductor.

The measuring device according to the invention is meant for use in an electric switching device and features a sensor arrangement, wherein the sensor arrangement comprises at least a sensor for measuring at least one of the parameters current strength and voltage of an electric current flowing through an electric path. Preferably, the sensor arrangement features at least one sensor for respectively measuring one of the parameters current strength and voltage per electric path of the switching device.

According to the invention, the measuring device features an insulating support with a sleeve made of an electrically insulating material, wherein the sleeve encloses a space suitable for receiving the electric path. According to the invention, the sensor arrangement is arranged on an outer side of the sleeve. The sleeve specifically has a form that might be described as a tube segment or as a hollow cylinder, wherein non-circular or non-round cross sections, for instance a rectangular cross section, are conceivable. The enclosed space extends along a longitudinal dimension of the sleeve. In order to receive the electric path, the sleeve is open at both ends in the longitudinal dimension. The sensor arrangement is arranged outside of the enclosed space and separated from the electric path by the wall of the sleeve.

An advantage of the measuring device according to the invention is that the insulating support serves to isolate the electric path from a secondary circuit of the sensor arrangement on the one hand, and as a recess for the sensor arrangement on the other hand. The embodiment of the insulating support as a sleeve receiving the electric path allows for an advantageous positioning of the sensor arrangement at a brief distance from the electric path on the one hand, and within an enclosure of the switching device on the other hand.

In a preferred embodiment, the insulating support features a separating wall made out of electrically insulating material, the separating wall extending radially outward from the sleeve. In particular, the separating wall extends in a plane, essentially at a right angle to the longitudinal dimension of the sleeve. The separating wall creates two spaces for the sensor arrangement that are electrically isolated from each other, such that advantageously, mutual interference by different sensors is prevented. Thus, on one side of the separating wall, a sensor for measuring the voltage in the electric path can be particularly advantageously positioned, while a sensor for measuring the current strength is positioned on the other side of the separating wall. With further preference, more than one separating wall made out of an electrically insulating material is provided, the walls being essentially arranged parallel to one another in the longitudinal dimension of the sleeve at a certain distance from each other, in order to create more than two electrically isolated spaces.

According to an additional preferred embodiment, a voltage meter is provided as a sensor for measuring the voltage, wherein the voltage meter is arranged on a circuit board surrounding the sleeve. The circuit board is preferably arranged parallel to the separating wall. The sensor for measuring the voltage of a current flowing through the electric path may thus be embodied in a particularly advantageous space-saving manner.

In an advantageous embodiment, the circuit board is attached to the separating wall. It is particularly preferred that at least one recess be provided in the circuit board to receive a protrusion of the separating wall. This allows for a particularly easy attachment of the circuit board. After reaching through the recess in the circuit board, the protrusion from the separating wall may be deformed on the side of the circuit board facing away from the separating wall, in order to obtain a permanent attachment. Further preferred, a space between the circuit board and the separating wall is filled with an electrically insulating cast mass. The fastening of the circuit board to the separating wall has an additional advantage here, being that when the cast mass is filled in, a shifting of the circuit board away from the separating wall is prevented by the pressure of the cast mass. Furthermore, it is particularly preferred that the insulating support feature an enclosure, the enclosure at least partially enclosing the sensor arrangement. The enclosure exists in particular of an external enclosure wall made from an electrically insulating material, wherein the outer enclosure wall may, for instance, be radially spaced and parallel to the sleeve. In the case of a cylindrical sleeve, the enclosure may be formed, for instance, by a similarly cylindrical enclosure wall with a greater diameter, arranged coaxially to the sleeve. The separating wall preferably extends from the sleeve up to the enclosure and preferably in particular connects them in one piece.

According to an additional preferred embodiment, the voltage meter features at least one contact pin arranged on the circuit board for tapping the voltage of the electric path. The contact pin preferably features a spring element. It is particularly preferred for the spring element to press a telescopic pin against the electric path by way of a preloaded spring. With further preference, the voltage meter features a voltage divider arranged on the circuit board for reducing a tapped voltage of the electric path.

According to an additional preferred embodiment, a measuring coil is provided as a sensor for measuring the current strength, wherein the measuring coil surrounds the sleeve.

In principle, the measuring device according to the invention may be provided to measure only either the current strength or the voltage. It is further preferred that the sensor arrangement respectively feature either a sensor for measuring the current strength as well as a sensor for measuring the voltage of an electric current flowing through the electric path. it is particularly preferred that the sensor for measuring the current strength, specifically an inductor, be separated from the sensor for measuring the voltage, in particular on the circuit board, by the separating wall.

An embodiment of the invention provides an electric switching device with at least one electric path, wherein according to the invention, one measuring device as previously described is provided for each electric path. Preferably, each electric path is guided through the sleeve of the insulating support of the respective measuring device.

Figure 1B:
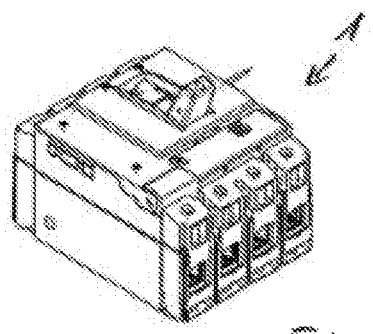

FIGS. 1a and 1b show two familiar embodiments of electric switching devices 1. Specifically FIG. 1a shows a three-pole switching device 1, and FIG. 1b shows a four-pole switching device 1. The characteristics of the invention are not visible in the representation of the switching devices 1.

Figure 2:
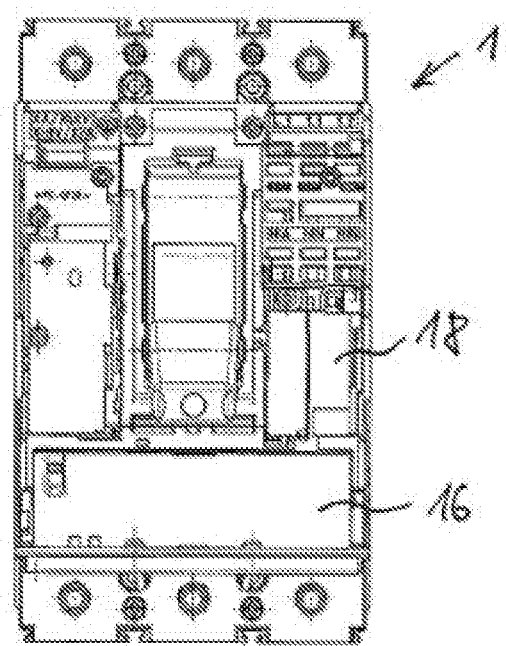

FIG. 2 shows a view of the opened electric switching device 1 according to FIG. 1a. This representation, like FIGS. 1a and 1b, only serves for explanatory purposes and shows no embodiment of the invention. Within the switching device 1, apart from additional components that are not addressed here, a magnetic trigger 18 and a converter enclosure 16 are arranged.

Figure 3:
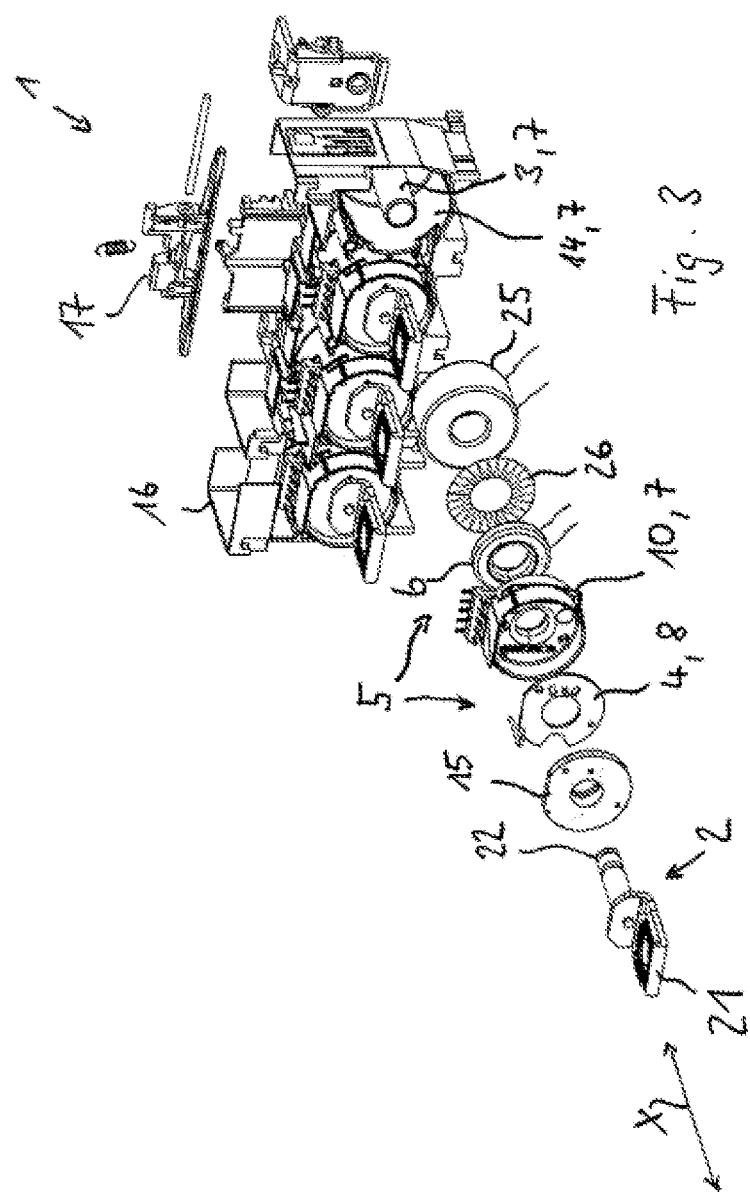
FIG. 3 shows a partial view of an embodiment of an electric switching device according to the invention with one embodiment of a measuring device according to the invention, partially in an exploded view.

FIG. 3 shows an embodiment of an electric switching device 1 according to the invention, wherein for the sake of clarity, only the converter enclosure 16 is shown here of the switching device 1, as well as a schematic view of a triggering mechanism 17. FIGS. 1a, 1b, and 2 serve for the purpose of clarifying the arrangement of the converter enclosure 16 in the switching device. The converter enclosure 16 is shown without an enclosure cover receives an embodiment of a measuring device according to the invention on, which will be extensively described below in detail. The electric switching device 1 according to FIG. 3 has four poles, meaning that it features four electric paths 2, each electric path 2 being associated with a measuring device according to the invention. The electric path 2 features a cylindrical conductor section 22 and a connector terminal 21 arranged at its end in the form of an L-shaped angled metal sheet. The position of the cylindrical conductor section 22 defines a longitudinal dimension X. Of the four measuring devices, one is shown in an exploded view along the longitudinal axis X. The additional embodiments refer to this one measuring device but apply similarly to the other ones.

The measuring device according to the invention features a sensor arrangement 5 and an insulating support 7. In the illustrated exemplary embodiment, the sensor arrangement 5 comprises a sensor 6 for measuring a current strength and a sensor 8 for measuring a voltage of an electric current flowing through the electric path 2. According to the invention, the insulating support 7 features a sleeve 3 made of electrically insulating material, wherein the sleeve 3 encloses a space suitable for receiving the electric path 2. In the shown exemplary embodiment, the sleeve 3 is formed as a hollow cylinder, since the electric path 2 features the cylindrical conductor 22 in the respective portion. According to the invention, the sensor arrangement 5 is arranged on an outer side of the sleeve 3, and is thus electrically insulated from the electric path 2.

The insulating support 7 preferably features a separating wall 10, also made of an electrically insulating material. The separating wall 10 extends radially outward from the sleeve 3. The sensor 6 for measuring the current strength is separated by the separating wall 10 from the sensor 8 for measuring the voltage. By way of a sensor 8 for measuring the voltage, a voltage meter 8 is provided, which is arranged on the circuit board 4 surrounding the sleeve 3. Additionally, a voltage divider, not visible here, is arranged on the circuit board 4 in order to reduce the voltage tapped at the electric path 2 to a level that is tolerable for the measurement electronics. The voltage divider on the circuit board 4 will be described below in the context of FIG. 6. Embodiments of the magnetic trigger 18 (cf. FIG. 2) are known that have an internal voltage divider. In such a case, for instance, the circuit board 4 can be dispensed with, and the voltage tap may be done at a different suitable location. A space between the circuit board 4 and the separating wall 10 is filled with an electrically insulating cast mass 15. By way of a sensor 6 for measuring the current strength, a measuring coil 6 is provided of a type commonly referred to as a Rogowski coil 6, the measuring coil 6 surrounding the sleeve 3. Furthermore, as in the shown exemplary embodiment, a Harvester coil 25 may be arranged on the sleeve 3, with an insulation layer 26 being arranged between the measuring coil 6 and the Harvester coil 25. The insulating support 7 features an enclosure 14 that encloses the sensor arrangement 5 at least in part. Details of the measuring device according to the invention will be explained below with reference to the other figures.

Figure 4:
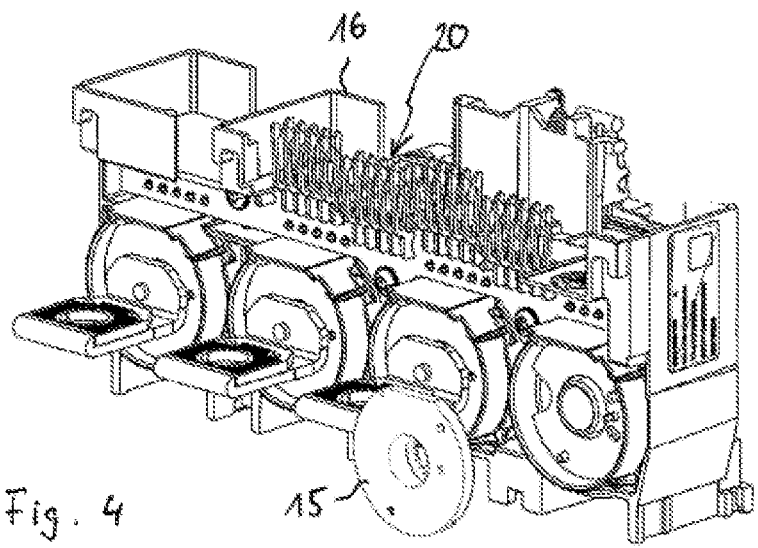
FIG. 4 shows an additional view of the measuring device according to the invention according to FIG. 3.

FIG. 4 shows an additional view of the measuring device according to the invention according to FIG. 3. The measuring device that had been shown in FIG. 3 in an exploded view is shown here in its assembled condition, except for the cast mass 15. A contact spring arrangement 20 of the converter enclosure 16, which was omitted in FIG. 3 for the sake of clarity, may be screwed onto the converter enclosure 16 and serves for receiving measurement signals from the measuring devices.

Figure 5:
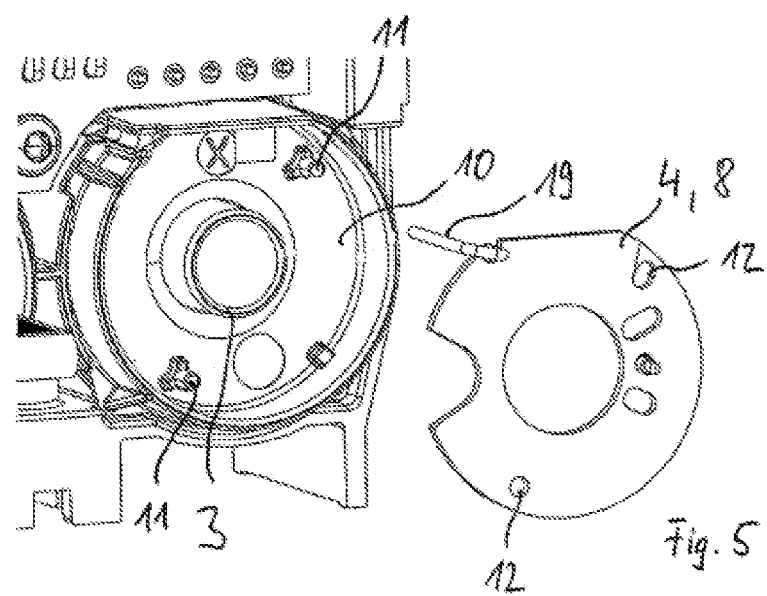
FIG. 5 shows a detail of the measuring device according to the invention according to FIG. 3.

FIG. 5 shows a detail of the measuring device according to the invention according to FIG. 3, specifically the separating wall 10 arranged on the sleeve 3, and the not yet mounted circuit board 4 of the voltage meter 8. The circuit board 4 features a connection cable 19 via which the measurement signal is transmitted to a contact of the contact spring arrangement 20. Preferably, the circuit board 4 is fastened to the separating wall 10. For these purposes, two recesses 12 are provided in the circuit board 4, each receiving a respective protrusion 11 of the separating wall 10. Through the deformation of the protrusions 11, the circuit board 4 is durably fixed in its position on the separating wall 10, and will therefore advantageously not be moved, for instance, when the cast mass 15 (FIG. 4) is filled in.

Figure 6:
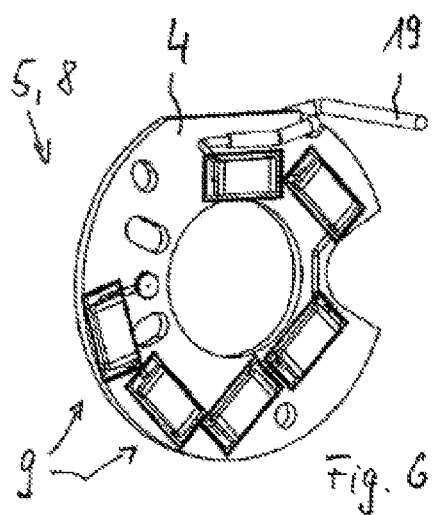
FIG. 6 shows an embodiment of a sensor arrangement of the measuring device according to FIG. 3.

FIG. 6 shows the circuit board 4 on its own, and therefore an embodiment of the sensor arrangement 5 of the measuring device, since the measuring device according to the invention may also feature a sensor arrangement 5 with only one sensor 8, which in this case is the voltage meter 8, which will be further described below. The voltage meter 8 features on the circuit board 4 a voltage divider 9 for reducing a voltage tapped from the electric path 2 (cf. FIG. 3). The reduced voltage is transmitted as a measurement signal via the connection cable 19 to a contact of the contact spring arrangement 20.

Figure 7:
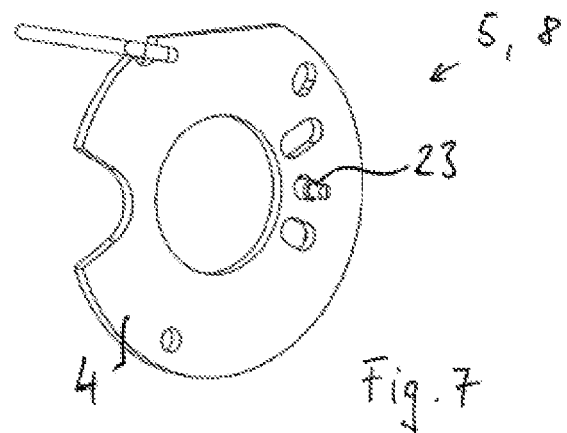
FIG. 7 shows the sensor arrangement according to FIG. 6 in a different view.

In FIG. 7, the sensor arrangement 5 according to FIG. 6 is shown in an additional view, showing the circuit board 4 from the side facing the connector terminal 21 of the electric path 2 (cf. FIG. 3) when in an assembled condition. The voltage meter 8 features a contact pin 23 on the circuit board 4 for tapping the voltage of the electric path 2, which will be described below with reference to FIG. 8.

Figure 8:
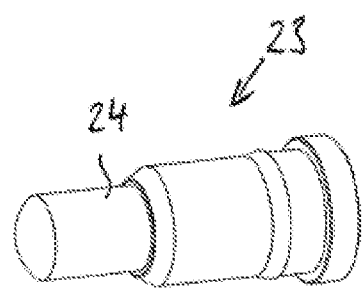
FIG. 8 shows a detail of the sensor arrangement according to FIG. 6.
Figure 12:
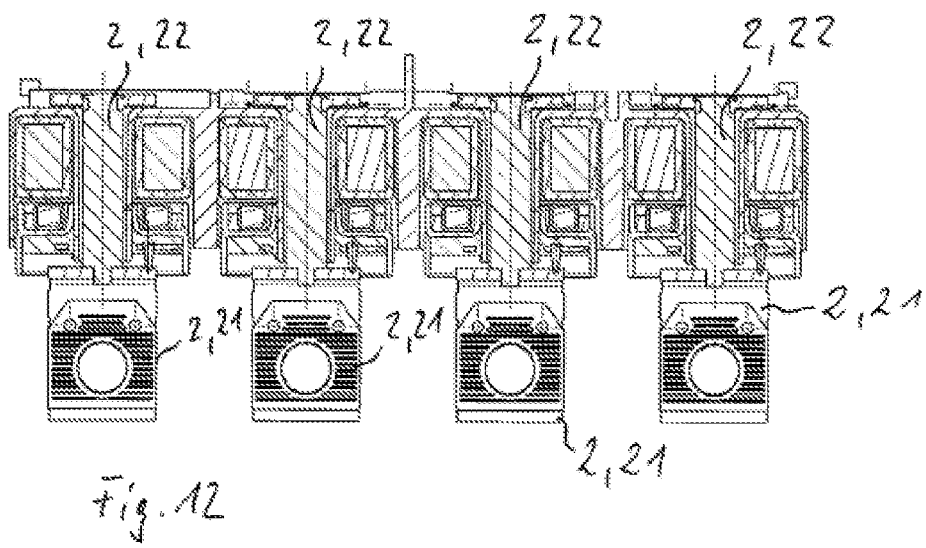
FIG. 12 shows a sectional view of the measuring device according to the invention according to FIG. 3.
Figure 13:
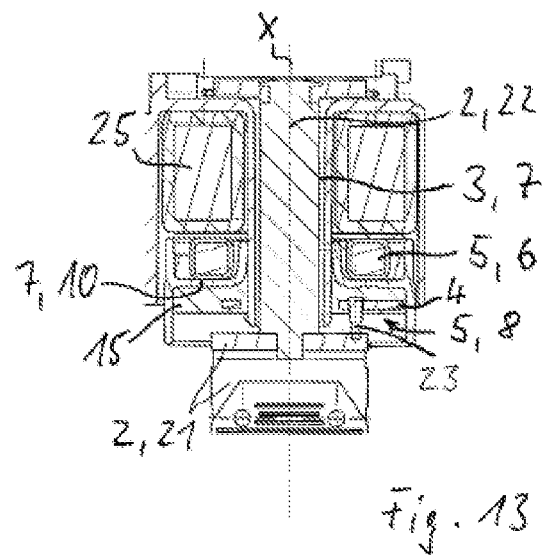
FIG. 13 shows a detailed sectional view of one of the measuring devices according to the invention according to FIG. 12.

FIG. 8 shows the contact pin 23 for tapping the voltage of the electric path 2 as a detail of the sensor arrangement 5 according to FIG. 7, with a spring element, not visible here, which presses a telescopic pin 24 against the electric path 2 by way of a preloaded spring, more specifically, against the portion of the L-shaped angled connector terminal 21 of the electric path 2 that is arranged perpendicular to the longitudinal axis X, as will be further explained in the context of FIGS. 12 and 13 below.

Figure 9:
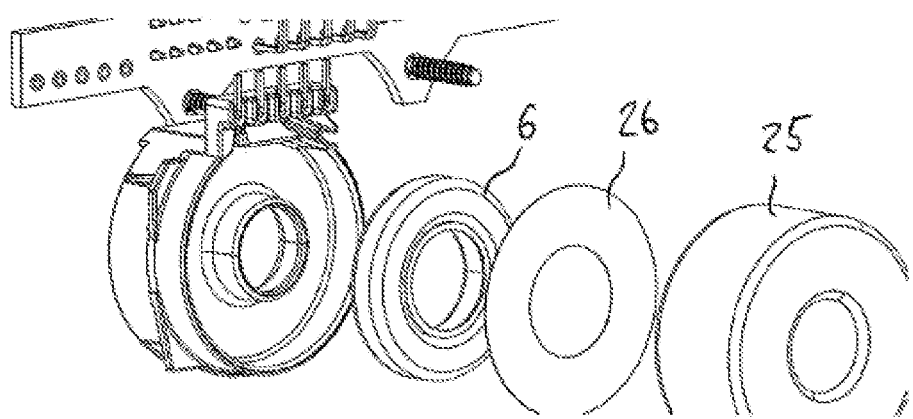
FIG. 9 shows an additional embodiment of a sensor arrangement of the measuring device according to FIG. 3.

FIG. 9 shows a further embodiment of the sensor arrangement 5 of the measuring device, consisting only of a sensor 6, in this case a Rogowski coil 6 for measuring the current strength of the current flowing through the electric path 2. The measuring coil 6 surrounds the electric path 2. Advantageously, the measuring coil 6 is for these purposes on the sleeve 3. Furthermore, a Harvester coil 25 is arranged on the sleeve 3, with an insulation layer 26 being arranged between the measuring coil 6 and the Harvester coil 25. The Harvester coil 25 serves for power supply, for instance for measurement electronics of the switching device 1. The measuring coil 6 and the Harvester coil 25 feature connection cables, not shown here, which are connected with the respective contacts of the contact spring arrangement 20 (cf. FIG. 4).

Figure 10:
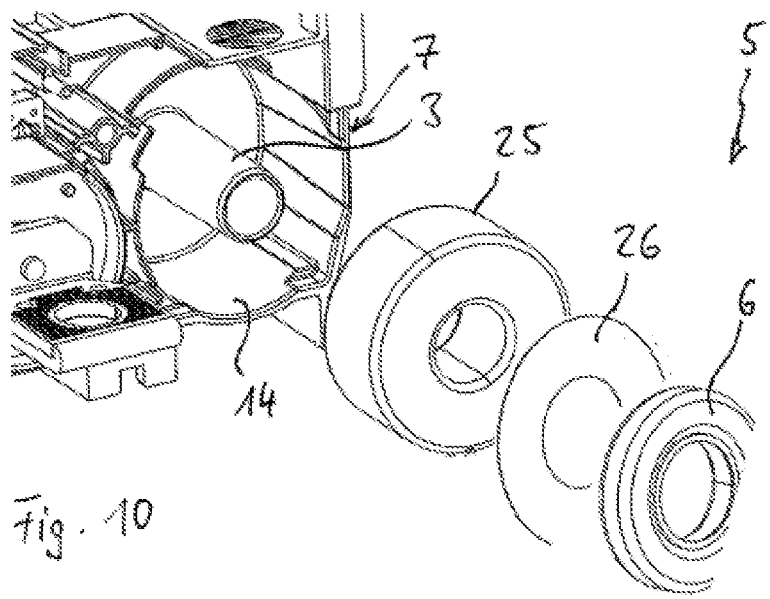
FIG. 10 shows a detailed view of an insulating support of the measuring device according to FIG. 3.

FIG. 10 shows a detailed view of the insulating support 7 of the measuring device according to the invention according to FIG. 3, wherein FIG. 10 shows the insulating support 7 with the not yet mounted sensor arrangement 5 according to FIG. 9. The insulating support 7 features the sleeve 3 and an enclosure 14. The separating wall 10, which will be described below in reference to FIG. 11, is only used after the assembly of the measuring coil 6 and the Harvester coil 25 (cf. FIG. 9).

Figure 11:
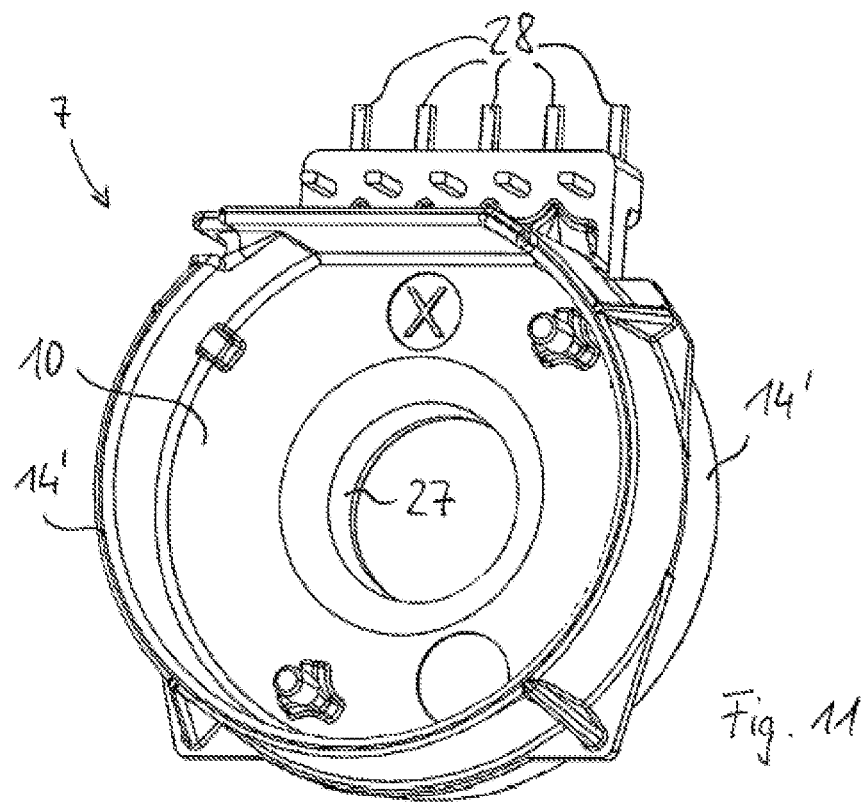
FIG. 11 shows a detailed view of the separating wall of an insulating support of the measuring device according to FIG. 3.

FIG. 11 shows a detailed view of the separating wall 10 of the insulating support 7 of the measuring device according to FIG. 3. A hub 27 on the separating wall 10 serves to position it on the sleeve 3 of the insulating support 7. The separating wall 10 shown in the exemplary embodiment also features parts 14' of the outer enclosure 14. Solder pins 28 serve the purpose of connecting the sensor arrangement 5 with the contact spring arrangement 20.

FIG. 12 shows the four measuring devices of the switching device 1 according to FIG. 3 in a sectional view, in a fully mounted condition. FIG. 13 shows a detailed sectional view of one of the measuring devices according to the invention according to FIG. 12. The electric path 2 consists of the cylindrical conductor section 22 and the connector terminal 21 arranged at its end. The cylindrical conductor section 22 is surrounded by the sleeve 3 of the insulating support 7. Outside of the insulating support 7, the sensor arrangement 5 is arranged, consisting of the measuring coil 6 for measuring the current strength, as well as the voltage meter 8. The voltage meter 8 features the circuit board 4 with the contact pin 23 for tapping the voltage at the leg of the connector terminal 21 that is perpendicular to the longitudinal axis X. The circuit board 4 is connected to the separating wall 10 that electrically isolates the voltage meter 8 from the measuring coil 6 and the Harvester coil 25. The circuit board 4 is further insulated and fixated with cast mass 15.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE LIST

1 Electric switching device
2 Electric path
3 Sleeve
4 Circuit board
5 Sensor arrangement
6 Sensors for measuring current strength, inductor, Rogowski coil
7 Insulating support
8 Sensor for measuring the voltage, voltage meter
9 Voltage divider
10 Separating wall
11 Protrusion
12 Recess
14, 14' Enclosure of the insulating support
15 Cast mass
16 Converter enclosure
17 Triggering mechanism
18 Magnetic trigger
19 Connection cable
20 Contact spring arrangement
21 Connector terminal
22 Cylindrical conductor section
23 Contact pin
24 Telescopic pin
25 Harvester coil
26 Insulation layer
27 Hub
28 Solder pins
X Longitudinal axis

What is claimed is:

1. A measuring device, comprising:
   a sensor arrangement; and
   an insulating support configured for use in an electric switching device,
   wherein the sensor arrangement comprises at least a sensor configured to measure a current strength and a sensor configured to measure a voltage of an electric current flowing through an electric path,
   wherein the insulating support comprises a sleeve comprised of electrically insulating material, the sleeve enclosing a space configured to enclose the electric path, the sleeve comprising a tube segment,
   wherein the sensor arrangement is arranged on an outer side of the sleeve so as to be disposed around the sleeve, and
   wherein the insulating support comprises an enclosure, the enclosure being cylindrical and arranged coaxially to the sleeve.

2. The measuring device as claimed in claim 1, wherein the sensor configured to measure the current strength of the electric current flowing through the electric path comprises a measuring coil, and
   wherein the measuring coil surrounds the sleeve.

3. The measuring device as claimed in claim 1, wherein the insulating support comprises a separating wall comprised of electrically insulating material, and
   wherein the separating wall extends radially from the sleeve outward.

4. The measuring device as claimed in claim 3, wherein the sensor configured to measure the voltage of the electric current flowing through the electric path comprises a voltage meter, the voltage meter being arranged on a circuit board surrounding the sleeve.

5. The measuring device as claimed in claim 4, wherein the voltage meter comprises at least one contact pin arranged on the circuit board and configured to tap the voltage of the electric path.

6. The measuring device as claimed in claim 4, wherein the voltage meter comprises a voltage divider arranged on the circuit board and configured to reduce a tapped voltage of the electric path.

7. The measuring device as claimed in claim 4, wherein the sensor configured to measure the current strength is separated by the separating wall from the voltage meter.

8. The measuring device according to claim 4, wherein the circuit board is attached to the separating wall.

9. The measuring device as claimed in claim 8, wherein the circuit board comprises at least one recess therein configured to receive a protrusion of the separating wall.

10. The measuring device as claimed in claim 9, wherein a space between the circuit board and the separating wall is filled with an electrically insulating cast mass.

11. An electric switching device with at least one electric path, wherein for every electric path, the measuring device as claimed in claim 1 is provided.

12. The electric switching device as claimed in claim 11, wherein each electric path is guided through the sleeve of the insulating support of the respective measuring device.

13. A measuring device, comprising:
    a sensor arrangement; and
    an insulating support configured for use in an electric switching device,
    wherein the sensor arrangement comprises a sensor configured to measure at least one of a current strength and a voltage of an electric current flowing through an electric path, wherein the insulating support comprises a sleeve comprised of electrically insulating material, the sleeve enclosing a space configured to enclose the electric path, the sleeve comprising a tube segment,
wherein the sensor arrangement is arranged on an outer side of the sleeve so as to be disposed around the sleeve, and
wherein the insulating support comprises an enclosure, the enclosure being cylindrical and arranged coaxially to the sleeve.

* * * * *